(12) United States Patent
Bolzenius et al.

(10) Patent No.: US 11,070,201 B2
(45) Date of Patent: Jul. 20, 2021

(54) APPARATUS FOR CONTROLLING AN ELECTRONIC SWITCHING UNIT

(71) Applicant: HELLA GmbH & Co. KGaA, Lippstadt (DE)

(72) Inventors: Steffen Bolzenius, Meschede (DE); Andreas Dick, Gummersbach (DE); Michael Loenneker, Paderborn (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/516,717

(22) Filed: Jul. 19, 2019

(65) Prior Publication Data

US 2019/0341916 A1 Nov. 7, 2019

Related U.S. Application Data

(63) Continuation of application No. PCT/EP2018/050935, filed on Jan. 16, 2018.

(30) Foreign Application Priority Data

Jan. 19, 2017 (DE) ...................... 10 2017 100 972.8

(51) Int. Cl.
*H03K 17/06* (2006.01)

(52) U.S. Cl.
CPC ... *H03K 17/063* (2013.01); *H03K 2217/0063* (2013.01); *H03K 2217/0081* (2013.01)

(58) Field of Classification Search
CPC ................ H02M 3/156; H02M 3/1582; H03K 2217/0081; H03K 2217/0063
See application file for complete search history.

(56) References Cited

U.S. PATENT DOCUMENTS

| 4,633,106 | A | 12/1986 | Backes et al. |
| 5,010,261 | A | 4/1991 | Steigerwald |
| 6,201,717 | B1 * | 3/2001 | Grant ...................... H02M 3/07 363/131 |
| 6,556,053 | B2 * | 4/2003 | Stanley ................... H02M 1/08 318/293 |
| 8,558,586 | B1 * | 10/2013 | Martin ................. G11C 7/1057 327/108 |
| 9,184,742 | B2 * | 11/2015 | Knoedgen ............ H03K 17/162 |
| 2009/0015224 | A1 | 1/2009 | Hirao et al. |
| 2013/0106374 | A1 | 5/2013 | Ball |
| 2015/0340496 | A1 | 11/2015 | Zhang et al. |
| 2015/0349776 | A1 | 12/2015 | Abouda et al. |

FOREIGN PATENT DOCUMENTS

DE 19954538 A1 5/2001

OTHER PUBLICATIONS

International Search Report dated Mar. 28, 2018 in corresponding application PCT/EP2018/050935.
"Datasheet IRS2181/IRS21814(s)Pbf", Nov. 27, 2006 (Nov. 27, 2006) http://www.infineon.com/dgdl/irs2181.pdf.
"Application Note AN-978 HV Floating MOS-Gate Driver ICs Gate drive requirement of high-side devices", Mar. 23, 2007.

\* cited by examiner

*Primary Examiner* — An T Luu
(74) *Attorney, Agent, or Firm* — Muncy, Geissler, Olds & Lowe, P.C.

(57) ABSTRACT

An apparatus for permanently controlling an electronic switching unit, the apparatus including a controlling driver unit for supplying a control signal to the electronic switching unit using a charge storage device, and a charging driver unit for recharging the charge storage device.

19 Claims, 2 Drawing Sheets

APPARATUS FOR CONTROLLING AN ELECTRONIC SWITCHING UNIT

This nonprovisional application is a continuation of International Application No. PCT/EP2018/050935, which was filed on Jan. 16, 2018, and which claims priority to German Patent Application No. 10 2017 100 972.8, which was filed in Germany on Jan. 19, 2017, and which are both herein incorporated by reference.

BACKGROUND OF THE INVENTION

Field of the Invention

The present invention relates to an apparatus for controlling an electronic switching unit and to a system and a method for controlling an electronic switching unit.

Description of the Background Art

From the prior art, it is known that electronic switching units such as N-Channel MOSFETs (Metal Oxide Semiconductor Field-Effect Transistor) are used to break a circuit in the event of a fault. In particular, high electrical power can also be switched in this way, and in the event of a fault, for example, a load can be separated from a high power supply voltage. Accordingly, the switching unit must be configured to permanently conduct a high electrical current, so that the current flow through the switching unit is reduced or largely prevented only in an emergency situation.

The permanent switching of the electronic switching unit often poses a technical challenge since a switching signal must be supplied for the switching unit whose electrical voltage lies above the power supply voltage of the apparatus for controlling the switching unit.

It is therefore known from the prior art to use certain integrated circuits (ICs) for control. The ICs, which are developed specifically for switching in accordance with such a requirement, however, are complicated to manufacture and can often be used only inflexibly for building a control device. Furthermore, the ICs are only slightly adaptable, and/or only adaptable in a costly and complex manner, to the specifications and further requirements which arise in the production of such a device.

Therefore, it is another possibility to develop an electronic circuit with discrete components. Such a discrete solution is highly adaptable but requires more space and a more complex production. Furthermore, such a solution is often limited in terms of driving capability.

SUMMARY OF THE INVENTION

It is therefore an object of the present invention to at least partially reduce the aforementioned disadvantages. In particular, it is an object of the invention to propose an apparatus for controlling an electronic switching unit, in particular an N-Channel MOSFET (or also: NMOS), wherein preferably, the electronic switching unit can be operated permanently conductively (turned on) in a technically simple and cost-effective manner. Further, in particular a good driving capability is to be provided for turning on and/or off the electronic switching unit. In addition, in particular, a control apparatus is to be provided which saves space and/or is particularly reliable.

In particular, the object is achieved in an exemplary embodiment by an apparatus, in particular an electrical or electronic arrangement, for controlling an electronic switching unit, preferably a power switching unit, in particular a MOSFET, preferably an N-Channel MOSFET and/or a power MOSFET.

The apparatus according to the invention can comprises at least: a controlling driver unit for providing a control signal to the electronic switching unit, in particular at a gate connection, using a charge storage device, and a charging driver unit for recharging the charge storage device.

In this case, it is provided in particular for the controlling driver unit and the charging driver unit (for example, monolithically and/or electrically connected to one another) to be integrated into a common driver module (in particular a driver element, for example in the manner of an IC). In this case, for example, the charge storage device, in particular as a capacitor, is integrated outside of the driver module in a current path between the controlling driver unit and the electronic switching unit such that the control signal is output or formed as a function of the charge storage device.

In other words, a (in particular just one) driver module is provided which includes (in particular exclusively) both the controlling driver unit and the charging driver unit. This has the advantage that a particularly reliable control of the electronic switching unit can be provided, in particular with improved driving capabilities, as compared to a discrete solution. At the same time, flexibility and adaptability can be enhanced.

In particular, a driver unit, e.g., the charging driver unit and the controlling driver unit, in each case can be understood to be electronic drivers and, in the narrow sense, gate drivers, each of which are designed for controlling a (power) switch, such as, for example, a MOSFET. For example, for this purpose the respective driver unit can be designed as a half bridge driver. It is also conceivable that one of the driver units, especially the controlling driver unit, is designed as a high side gate driver, and another of the driver units, in particular the charging driver unit, is designed as a low side gate driver of a half bridge gate driver. In this case, both the high side gate driver and the low side gate driver can be integrated in the half bridge gate driver as a half bridge driver module, so for example, an IC. In other words, the driver unit can be designed as the individual driver elements of a (single) half bridge gate driver, which, for example, in each case usually serve to control one respective MOSFET. In this manner, the high side gate driver can be designed to control a switching unit (or an NMOS or MOSFET) in the high branch of a bridge circuit, and the low side gate driver may be configured to control another switching unit (or NMOS or MOSFET or low side FET) in the low branch of the bridge circuit. Preferably, (only) the low side gate driver may be further configured to be controlled by an external signal generator (or microprocessor, i.e., μC), for example by means of pulse width modulation (PWM). In particular, the invention is based on the idea that the low side gate driver does not serve for driving a low side FET or a switching unit in the low branch, but instead serves as a charging driver unit together with the controlling driver unit for permanent control of the high side FET or the electronic switching unit (possibly in a high branch).

The driver module can be designed as an electronic component and/or as an integrated circuit (IC or monolithic circuit). In particular, the driver module comprises an integrated electronic circuit (chip) and/or a chip housing in which the circuit is encapsulated. The driver module can comprise a combination of a plurality of electronic semiconductor components, in particular at least one transistor and/or at least one diode. In particular, so as to produce the apparatus according to the invention, the driver module can be connected to further electrical and/or electronic components on a printed circuit board. Preferably, therefore, the driver module can comprise for this electrical connection a plurality of electrical contacts which can be brought directly or indirectly in electrical contact with the circuit board.

The driver module can be designed as a half bridge gate driver, such that the controlling driver unit is configured as a high side gate driver of the half bridge gate driver and the charging driver unit (original) is configured as a low side gate driver of the half bridge gate driver. The driver module can be an IC, preferably designed as a half bridge gate driver IC. This has the advantage that only a small number of components is necessary, and installation space can be saved on the board.

The driver module can be used to be able to permanently operate (on or off) in a supply line at least or precisely or at most a (single) electronic switching unit, in particular one or more (N-channel) MOSFETs switched in parallel. For this purpose, for example, a switching of the driver module takes place, which is thus used in another manner than the original intended use of the driver module.

A part of the driver module, namely in particular the charging driver unit (in particular a low side gate driver), can be operated with a defined frequency and pulse width modulation (PWM) as a push pull stage of a charge pump. In this manner, the charging driver unit can charge the charge storage device, in particular a (bootstrap) capacitor, in particular of the controlling driver unit (or the high side gate driver), (pursuant to the defined frequency). The controlling driver unit (in particular as a high side gate driver) then serves, for example, for controlling the electronic switching unit (e.g., as a high side MOSFET through a gate contact). Traditionally, the half bridge driver can only be used for the clocked (PWM) operation in a half bridge, so that a bootstrap capacitor must be recharged in each period if the source potential of the electronic switching unit is pulled through the low side MOSFET to ground and thus energy for turning on the high side MOSFET is again available. In particular, this behavior can be improved due to the advantageous design according to the invention so that control (for example, in the switched-on state) of the electronic switching unit is effected permanently.

Furthermore, it is optionally possible in the context of the invention that the charging driver unit is designed as a push pull stage to form a charge pump so as to preferably provide charge tracking for the charge storage device, so that in particular the electronic switching unit can be permanently operated on and/or off by the control signal. In particular, the term "permanently operated on and/or off" can be understood to mean that the electronic switching unit can be operated continuously on and/or off, in particular under normal circumstances and/or within a period of time (for example, of any length) in which the control signal is supplied and/or the driver module is operated. Furthermore, the period of time depends on whether the driver module is operated, i.e., whether an operating voltage is provided for the driver module. In particular, by permanently providing the control signal, interruption of the switching state (i.e., on or off) can be avoided to wait for, for example, a clock cycle or a recharging of the charge storage device. This advantageously allows for the use of the electronic switching unit as a circuit breaker of which the switching state may not change under normal circumstances.

The charge storage device can be designed as a bootstrap capacitor so that preferably the control signal, in particular in the switched-on and/or active state, comprises a voltage (or potential) which is and/or can be greater than the supply voltage of the apparatus and/or the electronic switching unit and/or than a source potential of the electronic switching unit. In particular, the control signal is a gate potential at a gate terminal of the electronic switching unit. In this case, an output of the driver module, in particular a high out output, is preferably connected to a gate terminal of the electronic switching unit. This way, the electronic switching unit can be reliably and in particular permanently operated. In particular, the source potential is connected to at least one load (such as a battery and/or an internal circuitry in respective apparatus or the like), particularly of a vehicle.

Specifically, "permanent" can be understood that operating may be temporally indeterminate or take place for an arbitrarily long period of time and/or at least 1 h or at least 2 h or at least 10 h, wherein this preferably (exclusively) takes place under normal circumstances and/or within a period of time (for example, of any length) in which the control signal is delivered and or the driver module is operated.

Furthermore, it is conceivable that the charging driver unit is electrically connected to a signal generator, in particular a microcontroller and/or a PWM generator, so that preferably, the charging driver unit is clocked by the signal generator, and in particular is switchable by means of a pulse width modulation. In particular, the charging driver unit is operated in a clocked manner so that the charging driver unit forms at least part of a charge pump. Preferably, by means of the charging driver unit or by means of the low side gate driver, an (in particular permanent) electrical supply, in particular a 12 V (volt) supply, can be provided or ensured to the charge storage device, in particular independent of a source potential in the electronic switching unit. In this context, one can speak of charge tracking by means of the charging driver unit. Preferably, to this end, the charging driver unit is electrically connected with a charge pump capacitor.

It is also advantageous when the charging driver unit is electrically connected to a signal generator and/or to a charge pump capacitor, which are in each case preferably formed outside the driver module, so as to preferably form a charge pump for supplying electrical power to the controlling driver unit and/or to the charge storage device, in particular to a bootstrap capacitor. For example, for this purpose, the signal generator and/or the charge pump capacitor are electrically connected with contacts of the driver module, for example, via a printed circuit board of the apparatus according to the invention. In this way, reliable electrical control of the electronic switching unit can be ensured.

Another object of the invention is a system for the (at least partial) interruption (in particular of an electrical connection) of a circuit in the event of a fault, and/or for the (in particular permanent) preservation of the connection under normal circumstances, comprising: an electronic switching unit (in particular for at least partially interrupting and/or preserving the connection), a controlling driver unit for providing a control signal to the electronic switching unit, in particular to control the preservation and/or interruption, preferably using a charge storage device, and a charging driver unit for recharging the charge storage device.

In this case, it is provided in particular that the controlling driver unit and the charging driver unit are integrated in a common driver module. Thus, the inventive system has the same advantages as those that have been extensively described with reference to the inventive apparatus. Moreover, the inventive system can comprise an inventive apparatus.

The system can serve to interrupt a circuit, preferably an electrical connection (in particular a supply line), preferably in a vehicle. Alternatively, or additionally, the inventive system can also be used to carry out a safety shut-off (in an apparatus). Particularly preferably, the electrical connection serves to transfer electrical energy from at least one battery (for example a rechargeable battery and/or a battery system) to a load, in particular to a DC-DC converter. For example, the DC-DC converter connects in this case two different electrical systems of a vehicle, in particular a 12 V electrical system with a 48 V electrical system. For example, a voltage of at least or substantially 12 V is applied at least temporarily at the electronic switching unit in the supply line. Preferably, the interruption, in particular by the electronic switching unit, can achieve a complete or partial interruption (i.e., a predominant reduction) of the energy transfer and/or electrical connection, in particular to the DC-DC converter. For this purpose, for example, a switching of the electronic switching unit occurs in the event of a fault by means of the controlling driver unit or the control signal.

The electronic switching unit can be normally operated by the controlling driver unit (closed or turned on) in such a way that an electrical connection is made between an energy source (e.g., a battery) and a load. In the event of a fault, it may be possible for example that a short circuit to ground or another fault occurs in a load, in particular in a DC-DC converter. In such an event of a fault, interruption of the electrical connection should take place. For this purpose, the electronic switching unit is preferably operated by the controlling driver unit (opened or switched off) such that the electrical connection is at least partially interrupted (i.e., for example, a current flow is predominantly reduced or prevented). It may be possible that the electronic switching unit is designed as a power semiconductor switch so as to be able to switch even high voltages and/or currents in an electrical system of a vehicle.

In particular, the vehicle can be designed as a motor vehicle, for example, an electric vehicle and/or a hybrid vehicle and/or a passenger vehicle.

The electronic switching unit can be designed as a semiconductor switch, in particular a field-effect transistor, preferably an N-Channel MOSFET, to interrupt the circuit in the event of a fault. This allows for particularly reliable and quick interruption in the event of a fault. In particular, interruption of the circuit can also be understood to mean partial interruption, i.e., a reduction of the electrical current, since an electronic switching unit cannot provide complete physical disruption in the manner of a mechanical switch. Instead, the electrical resistance of the switching unit is increased and thus, the current flow is reduced to a minimum so that the current flow can be reliably limited in the event of a fault.

It may also be possible for the electronic switching unit to be electrically connected to a battery voltage and/or to a load, in particular a DC-DC converter, so as to disconnect the battery voltage from the load in the event of a fault. For example, the DC-DC converter serves to connect two electrical systems of a vehicle to each other.

Another object of the invention is to provide a method for controlling an electronic switching unit. It is particularly conceivable that a controlling driver unit and a charging driver unit are provided, which are jointly integrated in a common driver module.

In this case, it is in particular provided that at least one of the following steps is performed, wherein the steps are preferably carried out sequentially or in any random order, wherein preferably individual steps can also be carried out repeatedly: providing a control signal on the electronic switching unit by the controlling driver unit using a charge storage device, and recharging the charge storage device by the charging driver unit.

Thus, the inventive method has the same advantages as have been described extensively with respect to an inventive system and/or an inventive apparatus. In addition, the inventive method can be suitable for operating an inventive system and/or an inventive apparatus.

A further advantage can be achieved in the context of the invention if during an operating period of the driver module, the recharging normally is cyclically repeated (and in particular occurs to a sufficient extent) so that the control signal is normally permanently provided during the operating period so as to normally permanently switch the electronic switching unit during the operating period. In other words, the provision of the control signal may occur in such a manner that the switching state of the electronic circuit unit is normally permanently present and is altered only in the event of a fault or an exception. For example, for this purpose, recharging can be carried out in such a way (for example, with such a frequency) that a potential of the control signal normally never falls below a threshold value, wherein a control signal below the threshold would cause switching (e.g., turning off) of the electronic switching unit. In particular, thus, the electronic switching unit, preferably an (N-Channel) MOSFET, can be operated in a supply line in a permanently conductive (turned on) manner. This way, the power supply for the load can be reliably and permanently provided by the electronic control unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
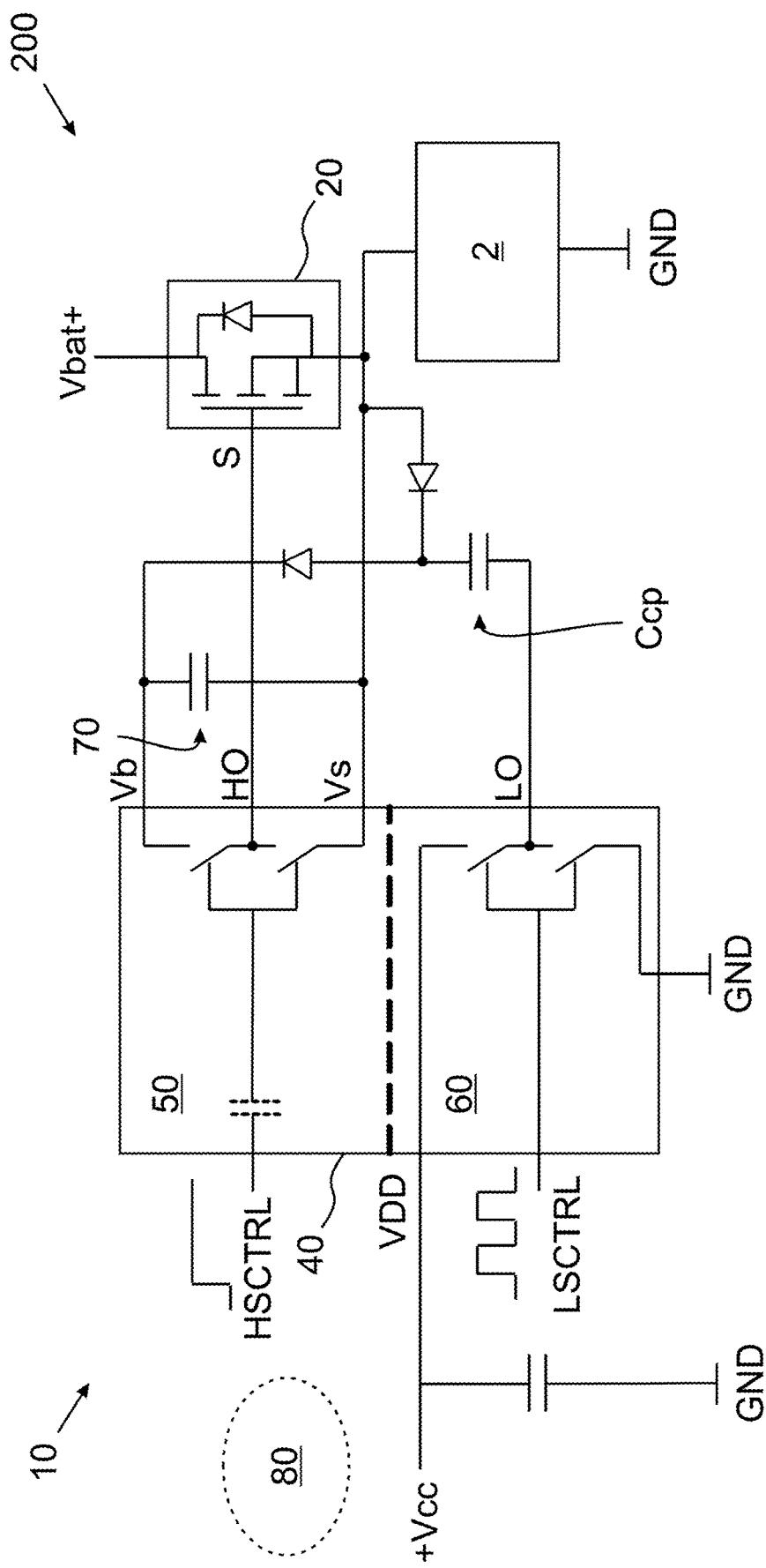
FIG. 1 is a schematic representation of an apparatus according to the invention and of a system according to the invention.

FIG. 1 schematically shows an apparatus 10 according to the invention and a system 200 according to the invention. In this case, an electronic switching unit 20, in particular an N-Channel MOSFET, is shown, which normally electrically connects a voltage, in particular a battery voltage Vbat, to a load 2. The load 2 is further connected to a ground potential GND.

To interrupt the electrical connection in the event of a fault, the electronic circuit unit 20 is controlled via a control signal S. This control signal S is provided by a controlling driver unit 50.

So that the electronic switching unit 20 is normally permanently switched on, or, in the event of a fault, permanently switched off, the control signal S must be permanently provided with a sufficient potential. In particular, the control signal S must be greater than the source potential Vs of the electronic switching unit 20 and/or the supply voltage Vcc and/or the voltage supply VDD of the controlling driver unit 50.

In order to solve this technical problem, a charging driver unit 60 is provided, which is integrated together with the driver control unit 50 in a driver module 40. This driver module 40 is designed, for example, as an IC, in particular as a half bridge driver.

In a half bridge driver, the charging driver unit 60 is conventionally used as a low side driver unit. In the present case, the charging driver unit 60 is used for charge tracking, in particular as a charge pump, for a charge storage device 70, in particular a capacitor, of the controlling driver unit 50. In other words, according to the invention, it may be possible for the charging driver unit 60 to be designed as a low side gate driver unit and still (e.g., exclusively) be used as a charge pump. For this purpose, in particular a (low side or low out) gate driver output LO is used to implement a push pull stage of the charge pump. For this purpose, the low out output LO is electrically connected to the charge storage device 70 and/or the controlling driver unit 50 via a charge pump capacitor Ccp, in particular via a charge pump input Vb. For driving, the controlling driver unit 50 also has a high side output HO.

The control of the controlling driver unit 50 can in turn take place via a corresponding input of the controlling driver unit 50, in particular via a digital input signal HSCTRL. Furthermore, the control of the charging driver unit 60 can be performed via a digital input signal LSCTRL, which is provided in particular by a signal generator 80.

Figure 2:
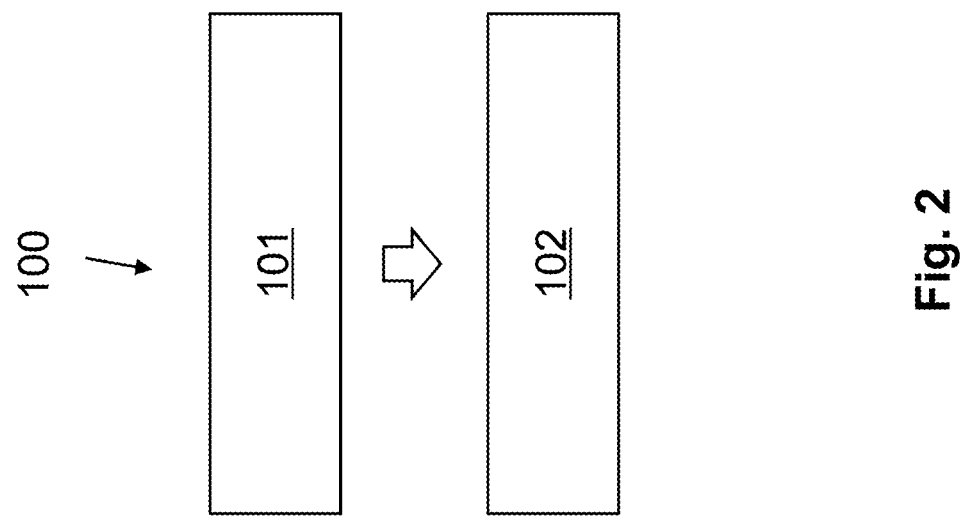
FIG. 2 is a schematic representation for visualizing a method according to the invention.

FIG. 2 schematically illustrates a method 100 according to the invention. In this case, according to a first method step 101, a control signal is provided by a controlling driver unit 50 at the electronic switching unit 20 by using a charge storage device 70. According to a second method step 102, the charge storage device 70 is recharged by a charging driver unit 60.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. An apparatus for controlling an electronic switching unit, the apparatus comprising:
    a controlling driver unit to provide a control signal to the electronic switching unit via a charge storage device; and
    a charging driver unit to recharge the charge storage device,
    wherein the controlling driver unit and the charging driver unit are configured to be integrated in a common driver module,
    wherein the driver module is a half bridge gate driver such that the controlling driver unit is designed as a high side gate driver of the half bridge gate driver and the charging driver unit is designed as a low side gate driver of the half bridge gate driver, and
    wherein only the low side gate driver is configured to be controlled by an external signal generator.

2. The apparatus according to claim 1, wherein only the low side gate driver is configured to be controlled by pulse width modulation.

3. The apparatus according to claim 1, wherein the charging driver unit is a push pull stage to form a charge pump so as to provide charge tracking for the charge storage device so that the electronic switching unit is adapted to be operated permanently switched on or off by the control signal.

4. The apparatus according to claim 1, wherein the charge storage device is a bootstrap capacitor, so that the control signal, in the switched on and/or active state, has an electrical potential that is greater than a source potential of the electronic switching unit.

5. The apparatus according to claim 1, wherein the charging driver unit is electrically connected to a signal generator or a microcontroller so that the charging driver unit is clocked by the signal generator and is adapted to be switched by pulse width modulation.

6. The apparatus according to claim 1, wherein the charging driver unit is electrically connected with a signal generator and/or with a charge pump capacitor, configured outside of the driver module to form a charge pump for supplying electrical power to the controlling driver unit and/or to the charge storage device or a bootstrap capacitor.

7. The apparatus according to claim 1, wherein a low out output of the low side gate driver is electrically connected to the charge storage device by a charge pump capacitor.

8. The apparatus according to claim 1, wherein a low out output of the low side gate driver is electrically connected to the controlling driver unit by a charge pump capacitor.

9. The apparatus according to claim 1, wherein a low out output of the low side gate driver is electrically connected to the controlling driver and the charge storage device unit by a charge pump capacitor.

10. A system for interrupting a circuit in the event of a fault, the system comprising:
    an electronic switching unit;
    a controlling driver unit to provide a control signal on the electronic switching unit using a charge storage device; and
    a charging driver unit for recharging the charge storage device, wherein the controlling driver unit and the charging driver unit are integrated in a common driver module,
    wherein the driver module is a half bridge gate driver such that the controlling driver unit is designed as a high side gate driver of the half bridge gate driver and the charging driver unit is designed as a low side gate driver of the half bridge gate driver, and
    wherein only the low side gate driver is configured to be controlled by an external signal generator.

11. The system according to claim 10, wherein the electronic switching unit is a field-effect transistor or an N-Channel MOSFET so as to at least partially interrupt the circuit in the event of a fault.

12. The system according to claim 10, wherein the electronic switching unit is electrically connected to a battery voltage and/or to a load or a DC-DC converter, so as to disconnect the battery voltage from the load in the event of a fault.

13. A method for controlling an electronic switching unit having a controlling driver unit and a charging driver unit that are integrated in a common driver module, the method comprising:

providing a control signal on the electronic switching unit by the controlling driver unit using a charge storage device; and recharging the charge storage device by the charging driver unit, wherein the driver module is a half bridge gate driver such that the controlling driver unit is designed as a high side gate driver of the half bridge gate driver and the charging driver unit is designed as a low side gate driver of the half bridge gate driver, and wherein only the low side gate driver is configured to be controlled by an external signal generator.

14. The method according to claim 13, wherein the recharging of the driver module is cyclically repeated so that the control signal is provided permanently so as to permanently switch the electronic circuit unit.

15. An apparatus for controlling an electronic switching unit, the apparatus comprising:
   a controlling driver unit to provide a control signal to the electronic switching unit via a charge storage device; and
   a charging driver unit to recharge the charge storage device,
   wherein the controlling driver unit and the charging driver unit are configured to be integrated in a common driver module, and
   wherein the controlling driver unit is configured to permanently provide the control signal to the electronic switching unit.

16. The apparatus according to claim 15, wherein the controlling driver unit is configured to permanently provide the control signal to the electronic switching unit with a potential greater than a source potential of the electronic switching unit.

17. The apparatus according to claim 15, wherein the controlling driver unit is configured to permanently provide the control signal to the electronic switching unit with a potential greater than a supply voltage of the controlling driver unit.

18. An apparatus for controlling an electronic switching unit, the apparatus comprising:
   a controlling driver unit to provide a control signal to the electronic switching unit via a charge storage device; and
   a charging driver unit to recharge the charge storage device,
   wherein the controlling driver unit and the charging driver unit are configured to be integrated in a common driver module, and
   wherein the controlling driver unit is configured to permanently provide the control signal to the electronic switching unit with a potential greater than a source potential of the electronic switching unit.

19. An apparatus for controlling an electronic switching unit, the apparatus comprising:
   a controlling driver unit to provide a control signal to the electronic switching unit via a charge storage device; and
   a charging driver unit to recharge the charge storage device,
   wherein the controlling driver unit and the charging driver unit are configured to be integrated in a common driver module, and
   wherein the controlling driver unit is configured to permanently provide the control signal to the electronic switching unit with a potential greater than a supply voltage of the controlling driver unit.

* * * * *